(12) United States Patent
Curtis et al.

(10) Patent No.: US 6,438,062 B1
(45) Date of Patent: Aug. 20, 2002

(54) MULTIPLE MEMORY BANK COMMAND FOR SYNCHRONOUS DRAMS

(75) Inventors: Michael William Curtis; William Paul Hovis, both of Rochester, MN (US); Steven William Tomashot, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 83 days.

(21) Appl. No.: 09/627,853

(22) Filed: Jul. 28, 2000

(51) Int. Cl.$^7$ ................................................. G11C 8/00
(52) U.S. Cl. ..................... 365/230.03; 365/230.01; 365/233
(58) Field of Search ........................... 365/230.03, 233, 365/230.07

(56) References Cited

U.S. PATENT DOCUMENTS

| | | | |
|---|---|---|---|
| 5,715,211 A | | 2/1998 | Toda ........................... 365/233 |
| 5,907,857 A | * | 5/1999 | Biswas ........................ 711/106 |
| 5,953,280 A | | 9/1999 | Matsui ........................ 395/230.03 |
| 5,953,286 A | | 9/1999 | Matsubara et al. .......... 365/233 |
| 5,987,574 A | * | 11/1999 | Paluch ......................... 711/158 |
| 6,247,084 B1 | * | 6/2001 | Apostol, Jr. et al. ........ 710/108 |
| 6,310,814 B1 | * | 10/2001 | Hampel et al. ............. 365/222 |
| 6,327,216 B1 | * | 12/2001 | Ryan ........................... 365/233 |

* cited by examiner

Primary Examiner—Michael S. Lebentritt
Assistant Examiner—Tuan T. Nguyen
(74) Attorney, Agent, or Firm—Karuna Ojanen

(57) ABSTRACT

An improved and much simplified method to access data banks in a memory system which provides the option of opening more than one bank in a single command. This is especially useful to achieve bursts of data across bank boundaries in a memory system of synchronous dynamic random access memory cards having fast memory bus speeds. The method decodes signals to generate a single command which may open one or more memory bank at a time. Logic can increment the banks, decrement a bank counter, and, if necessary, increment/decrement a row and/or uniquely address a column so that continual data bursts can be achieved seamlessly across bank boundaries in synchronous dynamic random access memory systems. The data banks may be opened all at once, or can be opened sequentially in a staggered manner according to a synchronous or asynchronous, with respect to the memory clock, time delay During that time delay a nop command or a chip deselect command may execute.

40 Claims, 15 Drawing Sheets

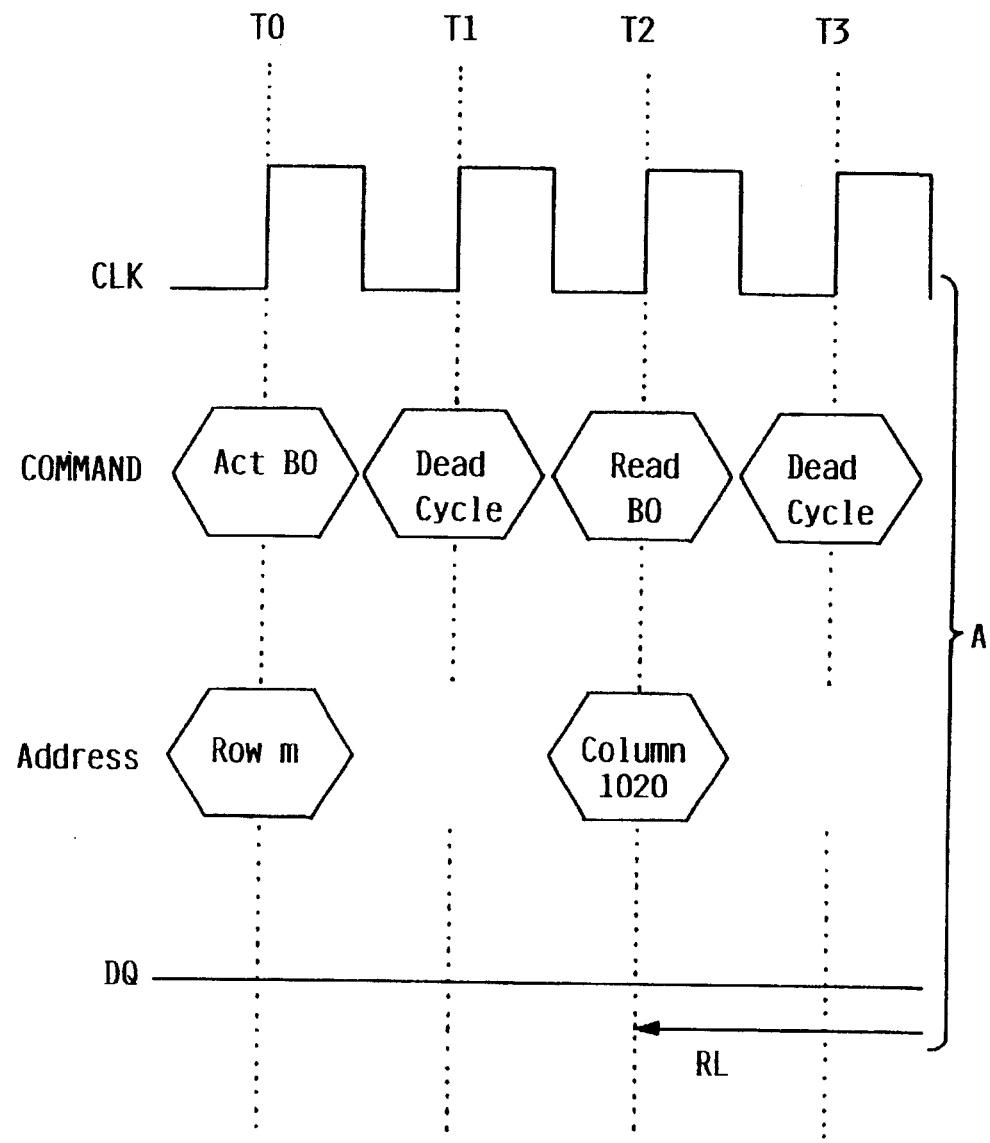
FIG. IA (PRIOR ART)

*DDR-II SDRAM used in this example; SDR or DDR-I would look slightly different.

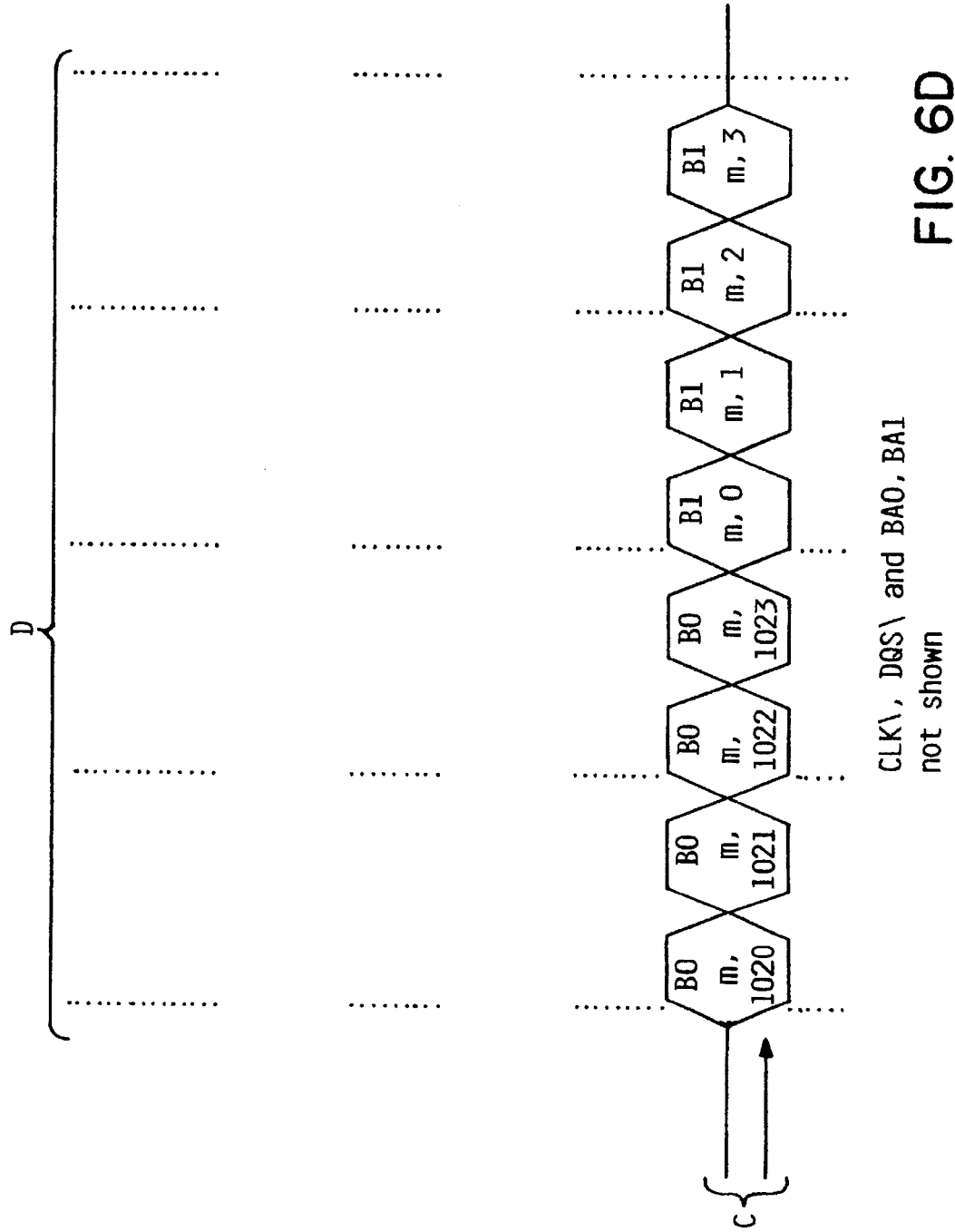

*DDR-II SDRAM used in this example; SDR or DDR-I would look slightly different.

US 6,438,062 B1

MULTIPLE MEMORY BANK COMMAND FOR SYNCHRONOUS DRAMS

TECHNICAL FIELD

This invention relates generally to the field of synchronous dynamic random access memory subsystems and more particularly provides a command to activate and open multiple memory banks.

BACKGROUND OF THE INVENTION

The endeavor for faster and faster computers have reached remarkable milestones since their inception and coming of age during the past sixty years. The beginning of the computer age was characterized by connecting vacuum tubes with large coaxial cables for wiring analog logic. If a new problem was to be solved, the cables were reconfigured. Today, coaxial cables have been replaced with high speed data buses; vacuum tubes have been replaced with high speed logic having transistors of new semiconductor materials and designs, all of which are limited only by the laws of physics. Initially, the slowest subsystem of computers was the processor subsystem. As processors became more efficient, the limiting function of the computer became the time required to transfer data to and from sources outside the computer.

To improve the performance of memory subsystems, memory was brought closer to the processor in the form of cache hierarchies. Cache hierarchies which are limited volume high-speed memories were incorporated into the same integrated circuit as the processor. Thus, data would be available immediately to the processor but the bulk of the data and operating programs was still stored in a larger memory within the computer, referred to as main memory. Efforts were directed toward accessing this main memory subsystem faster and more efficiently. New faster semiconductor materials were developed and used in the RAM—random access memory. More efficient circuits and methods of row and column addressing of the RAM memory were developed. Memory was connected to the processor and other I/O devices through more efficient buses and sophisticated bus command logic. Soon memory control logic became almost as complicated as the logic within the central processing unit having the processor and the cache hierarchy. Memory refresh circuits were developed to maintain the "freshness" and hence the accuracy of the data within memory. Compression/decompression engines were developed to efficiently rearrange stored data in memory banks.

Still other techniques to improve memory subsystem performance include overlapping and interleaving commands to the memory devices. Interleaving to route commands on different memory buses or different memory cards was improved by providing additional memory in the form of multiple devices and multiple memory banks within each device. Increasing the amount of data processed with each access to memory connected across a memory bus improved memory bus bandwidth.

Improvements in the speed of dynamic RAMs (DRAMs) have historically come from process and photolithography advances. More recent improvements in DRAM performance, however, have resulted from making changes to the base DRAM architecture that require little or no increase in die size. A bursting feature to allow multiple bits to be accessed from memory was developed. To implement the bursting feature, the starting address, the burst length and burst type are defined to the DRAM so the internal address counter can properly generate the next memory location to be accessed. The burst type defines whether the address counter will provide sequential ascending page addresses or interleaved page addresses within the defined burst length. Common processing in microprocessors access DRAM data in a four-bit burst length in either a sequential or interleave fashion. Optimum system performance can be achieved when data is fed to the processor at a rate as close as possible to the system clock but typically the processor is at a higher clock rate. Data accessed from a L1 cache comes close to meeting this requirement. When the requested data is accessed directly from the DRAM rather than the L1 or L2 cache, however, the burst rate is significantly degraded. Assuming the burst is from a DRAM memory page that is already open, the achievable burst rate at 66 megahertz using sixty nanosecond DRAMs is 5/3/3/3 cycles for fast page mode DRAMs which means that five clock cycles are required to access the first bit and three clock cycles are required to access each of the remaining three bits. The achievable burst rate is 5/2/2/2 for extended data output DRAMs. Clearly, there is a DRAM bandwidth bottleneck and the bursting feature alleviates the bottleneck in this and other scenarios concerning graphic applications which typically burst long streams of data. Once the first page address is accessed, the DRAM itself provides the address of the next memory location to be accessed. This address prediction eliminates the delay associated with detecting and latching an address provided externally to the DRAM.

Synchronous DRAMs (SDRAMs) and burst extended data output (BEDO) memory chips are two memory chip architectures that implement the bursting feature. A state of the art memory chip is the double data rate—II synchronous DRAM (DDR-II) which comprises high speed CMOS memory devices that can be organized as, for example, 256 megabytes, 512 megabyes, 1 gigabyte or more, into varying rows, columns, and banks that has its own memory clock. The DDR-II is fast; its memory control clock may run speeds up to 400 megahertz or higher but it also has a set burst length of four words which means that for bursts of longer than four words, a new column address select (CAS) command must issue every other clock cycle. Typically designers issue commands every other clock cycle on some slower memory subsystems so the voltage on the address and control lines are allowed to drop before a point-to-point chip select (CS) signal establishes the command. Under these circumstances as illustrated in the timing diagram of FIG. 1, a seamless burst cannot be achieved between multiple memory banks. For simplicity only the clock signal, CLK, of the memory control bus is shown as the uppermost signal and the CLK signal, although present, is not illustrated. Immediately below is the command of the action to be performed in memory. At time T0, a signal to activate bank B0 and an address of row m are given but according to the DDR-II specification, an empty or dead cycle must occur at time T1 to allow the voltages on the control lines to settle. Thus at time T2, an address for column 1020 and the command to read data from bank B0 are issued. There is then another undesirable dead cycle at time T3. At time T4 a command is issued to activate the next memory bank. The pattern repeats itself so that there is always a dead cycle between an activate command and a read command. Given a read latency of four clock cycles, reading data from row m, columns 1020–1023 of Bank B0 has completed at time T8 but because of the required dead cycle at time T3 to open up another column, there exists a latency when reading bursts across boundaries of different banks of the same row.

There is a need to eliminate latencies that currently exist when reading data bursts across memory bank boundaries of synchronous DRAM subsystems at high speeds without additional cost and additional hardware while still maintaining high bandwidth and high memory bus utilization.

SUMMARY OF THE INVENTION

These needs and others that will become apparent to one skilled in the art are satisfied by a method to access one or more memory banks in a synchronous dynamic random access memory system which comprises the steps of reading a single command to open of a plurality of synchronous dynamic random access memory banks, opening one of the memory banks, and then providing an option to open more than one of the memory banks. A key feature of the invention is to provide the option to open one or more memory bank with a single command.

The method may further comprise the steps of determining that more than one the memory bank is to be opened and then opening another of the memory banks. All of the banks to be opened may be opened at the same time; alternatively, all of the banks may be opened in a sequential, staggered manner. If the memory banks are to opened sequentially, then the banks could be opened according to a deterministic time delay which could either be synchronous or asynchronous to the memory device clock. A nop command or a next chip deselect command may execute during that time delay.

The method may further comprise incrementing/decrementing a bank address before opening another memory bank. The method may also comprise decrementing a bank counter while opening another memory bank. The method, moreover, provides that a row may be incremented/decremented before opening another memory bank. The method further provides that the same or a different column may be accessed if multiple memory banks are opened.

The method may further comprising bursting data to/from the open memory banks. The burst data may be to/from the same row of the open memory banks. Similarly, the burst data may be to/from the same column of the open memory banks. Each subsequent bank can be opened during the step of bursting data to/from the open memory banks.

The invention is further envisioned as a method to open one or more multiple data banks of a memory system, comprising the steps of reading a command to open one of a plurality of the memory banks; opening one of the plurality of memory banks; determining that more than one of said plurality of memory banks is to be opened and generating a single command to open more than one of the memory banks; incrementing a bank address; opening another of the memory banks; and bursting data to/from the same row of the open memory banks.

The invention may also be considered a computer system, comprising a computer processor, a memory connected on a bus to the processor, the memory comprising a memory controller connected on a memory bus to a plurality of synchronous dynamic memory banks, the memory controller to generate a single command having the option to open one or more of the memory banks; and a plurality of bus units connected to the processor and/or said memory via an external bus, the processor and/or one of the bus units to request access to an address in the memory banks. The computer processor may be an I/O processor/adapter and the memory controller may be a storage controller and one of said bus units might then be a second computer processor connected to the storage controller and further connected to an external bus which might be a peripheral computer interface (PCI) bus. The storage controller may further be connected across a small computer system interface (SCSI) bus to a larger memory device.

The invention is also a memory system apparatus for the storage of and retrieval of binary data, comprising a means to access one or more synchronous dynamic random access memory banks, a means to decode a plurality of commands on a memory command bus to access the plurality of synchronous dynamic random access memory banks; a means to provide the option to open one or more of the synchronous dynamic random access memory banks; and a means to input/output data continuously from the opened synchronous dynamic random access memory banks.

Further scope of applicability of the present invention will become apparent from the detailed description given herein. It should be understood, however, that the detailed description and the specific examples, while indicating preferred embodiments of the invention, are given by way of illustration only. Various changes and modifications within the spirit and scope of the invention will become apparent to those skilled in the art upon review of the detailed description.

BRIEF DESCRIPTION OF THE DRAWING

The present invention will become more fully understood from the detailed description and accompanying drawings, wherein.

DETAILED DESCRIPTION OF THE PREFERRED EMBODIMENT

Figure 2:
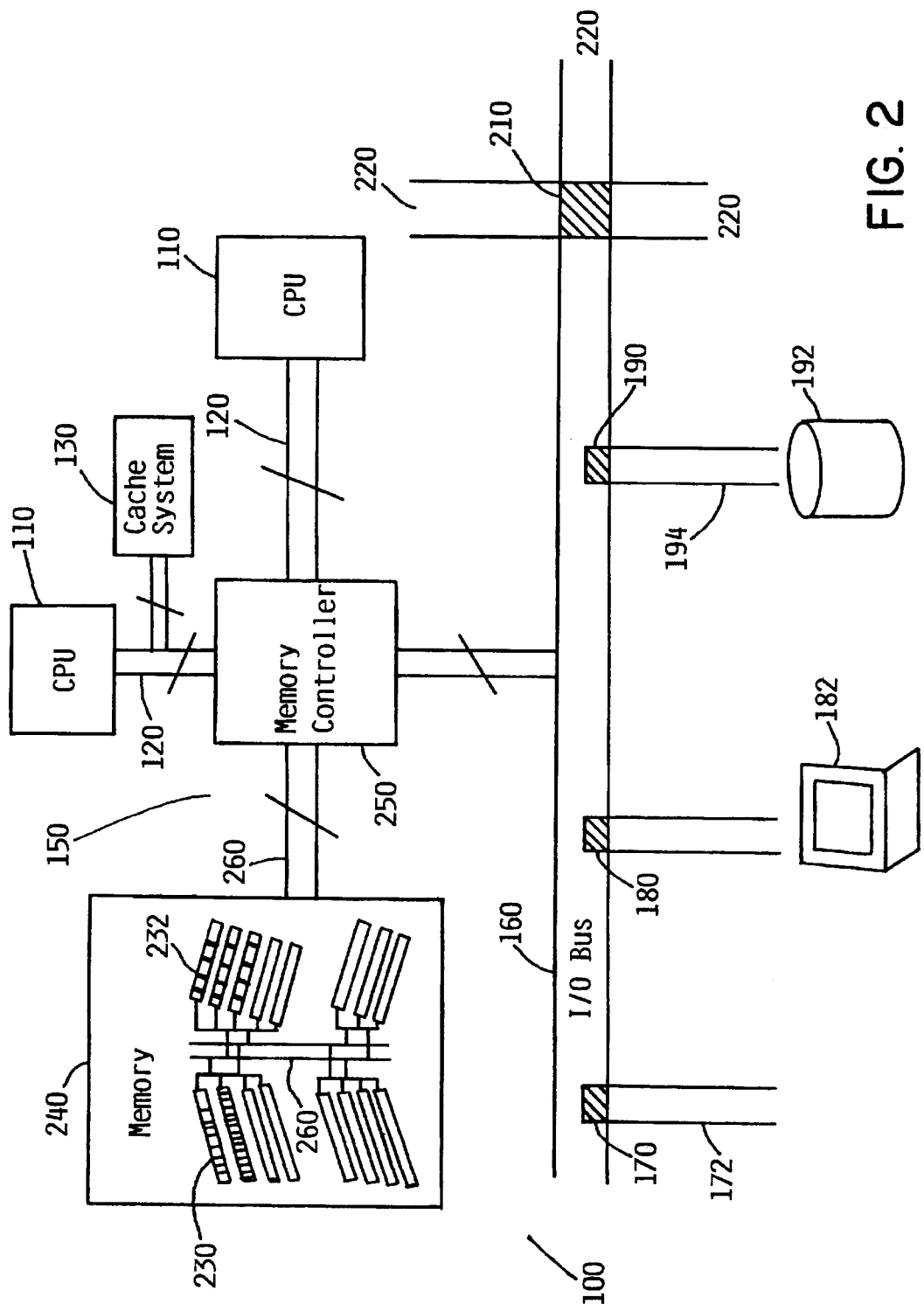
FIG. 2 is a simplified block diagram of a basic memory subsystem incorporating a computer processor capable of implementing the invention.

Referring to the figures wherein like numerals refer to the same or similar elements throughout and in particular with reference to FIG. 2, illustrated is a simplified block diagram of a computer information processing system 100 incorporating a memory subsystem 150 and a central processing unit (CPU) 110 which may operate in accordance with principles of the invention. The computer information processing system 100 has at least one CPU 110 having a plurality of functional units to perform operations on data via instructions and may have, for example, a PowerPC reduced instruction set architecture. A CPU 110 may be connected to other CPUs 110 using an internal bus network 120. Connected to the CPUs 110 via the internal bus 120 may be a cache system 130 employing high speed memory nearer the CPU 110 for the storage of data and instructions that are quickly accessed by the processor. Cache system 130 may typically comprise a level one data cache, a level two data and instruction cache and may also have intermediate caches or other level of caches to store and route data and/or instructions. Although cache system 130 is shown external to a CPU 110; each CPU 110 may have its own cache system 130 on the same integrated circuit. Connected to the cache system 130 is main storage memory subsystem 150.

The memory subsystem 150 typically comprises an array of memory cards 230 referred to as main storage 240 and a memory controller 250 which interacts with the cache system 130 and, through an external bus 160, with various input/output (I/O) devices for the transfer of data and instructions. Typically within the computer information processing system 100, these I/O devices may include an I/O bus attachment 170 for communication with an external network 172 using specified protocols such as Ethernet, PCI, TCP/IP, etc. Other examples of the external network 172 include a limited-access network within a company or a specified configuration or an unlimited-access network such as the Internet. Workstation controller 180 may be connected to other computer systems which are similar to its own computer system or may be connected to a larger computer/server in which case the computer information processing system 100 would be considered a client. On the other hand and even at the same time, the computer system 100 may be configured to be a server to provide operating systems and client programs for other clients by interacting with other workstations 182 through workstation controller 180 or over the I/O bus attachment 170. Typically, the computer system 100 may also be connected to external memory storage 192, such as a disk drive or tape drive, through a storage controller 190. Examples of other functional units attached to either an internal or an external bus, herein be referred to as bus units, may include processors, I/O hub controllers, compression engines, external storage device controllers, workstation controllers, etc.

The memory system 150 is suitable for connection to a computer information processing system 100 and provides large amounts of storage to be accessed at high speed by the host computer information processing system 100. The main functional units of the memory subsystem 150 are the memory controller 250 and a plurality of random access memory cards 230 in memory 240 in which data and programs are stored during the operation of the computer data processing system 100. Each of the memory cards 230 of memory subsystem 150 preferably comprises an array of memory devices 232, preferably SDRAM-II, DDR-I, or DDR-II memory chips, although the invention is also applicable to DRAM and/or SRAM memory chips. Typically, there may four to thirty-two, or more or less, many memory devices 232 physically located and interconnected with each other on the same memory card 230. All or some of the memory cards 230 may be interconnected on a memory bus 260, of which there may be several memory buses. Memory controller 250 manages the transfer of data and other information to and from the memory subsystem 150 at high speed and determines first which memory bus, then which memory card on that bus, then which memory chips on that memory card and lastly which memory banks on that memory card are associated with a memory command referring to a row and column address in memory.

Figure 1B:
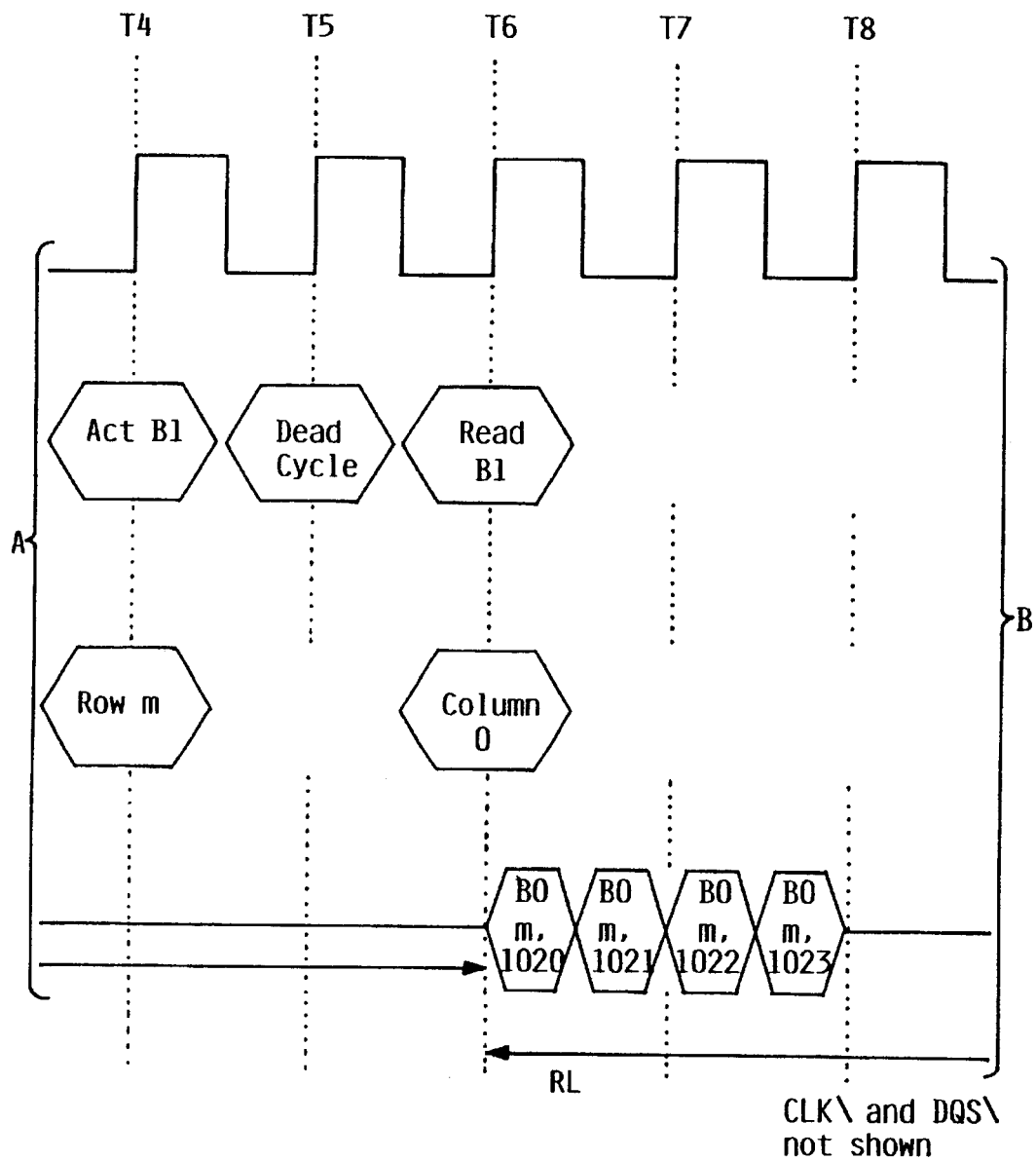
FIG. 1 is a timing diagram of prior art bank activate and read commands with respect to the memory clock and the resultant output data.
Figure 1C:
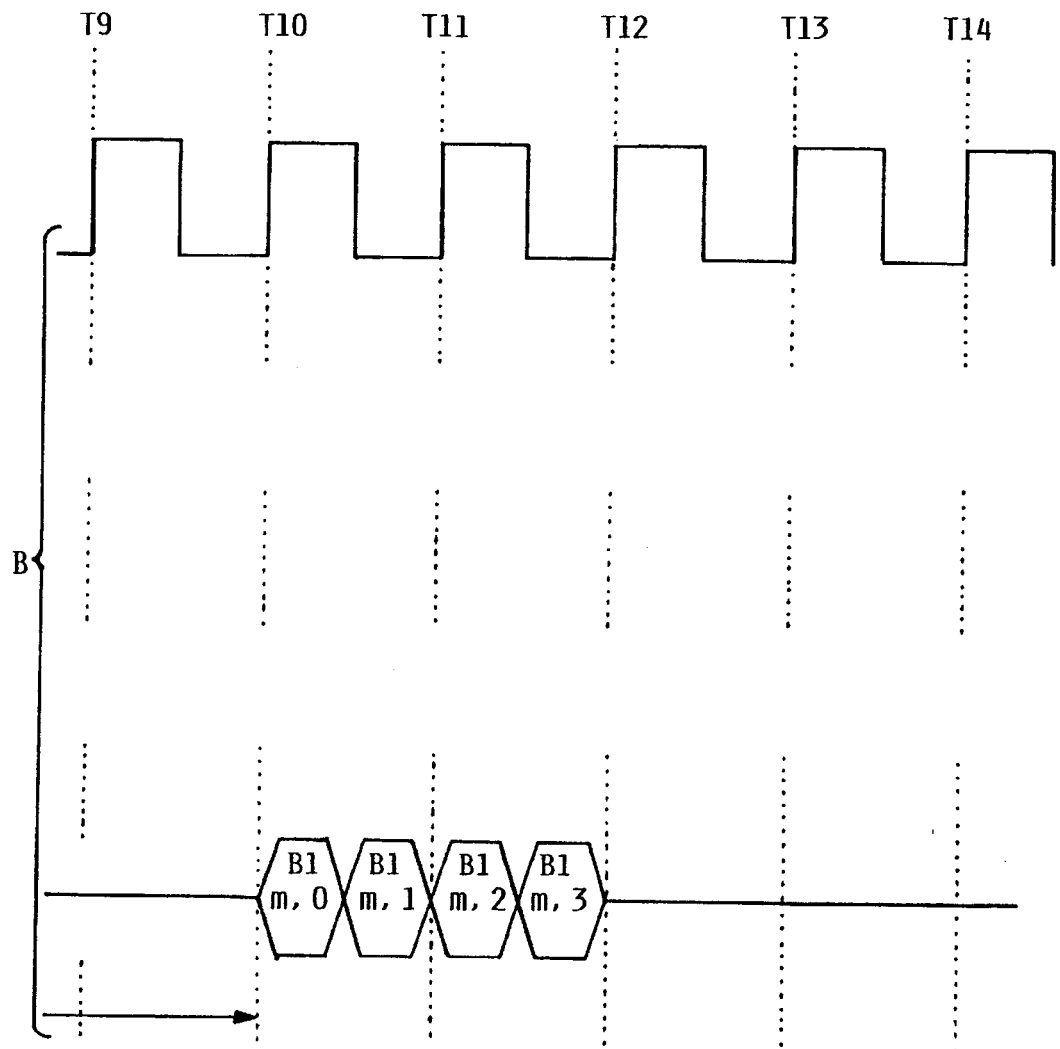

The memory controller 250 is connected to the CPUs 110 via a bus network comprising internal bus 120 and external bus 160 which may comprise one or more internal buses 120 and one or more external buses 160 for rapid intercommunication between the CPUs 110, the remainder of the memory subsystem 150, I/O devices 170, and other bus units. One can easily appreciate that there may be a cache system 130 associated with and included within each CPU 110, and each CPU 110 may communicate directly with I/O devices 170 on either or both an internal bus 120 and an external bus 160. The memory subsystem 150 of FIG. 1 may be either directly or indirectly connected not only to the workstation controller 180 and the storage controller 190, but also to a nodal interconnect 210 including a network switching fabric of local or distant processors or other memory controllers and other devices 220 having such functions as monitoring bus or other communication network traffic, compression and decompression of data which may be internal or external to the memory controller 250 and may or may not be located between storage controller 190 and memory subsystem 150. Other bus units not shown which provide memory commands to the memory controller 250 may also be provided.

Although shown here as within close proximity to the CPU 110, the features of the memory system pertinent to the invention may also be embodied in the storage controller 190 connected to external memory storage 192. External memory storage may be hard disk drives, more memory cards having multiple DDR-II memory devices, optical memory storage, in which case each may be considered a separate memory device. In this case and by way of example only, the bus 194 may be a SCSI bus and the I/O bus 160 may be a PCI bus. Storage controller 190 may contain an I/O adapter or even an I/O processor. Therefore though shown and discussed with respect to the main CPU 110, the logic and functions of the invention with respect to opening multiple memory banks with a single command may extend to other storage and logic connected to an information handling system.

Figure 3:
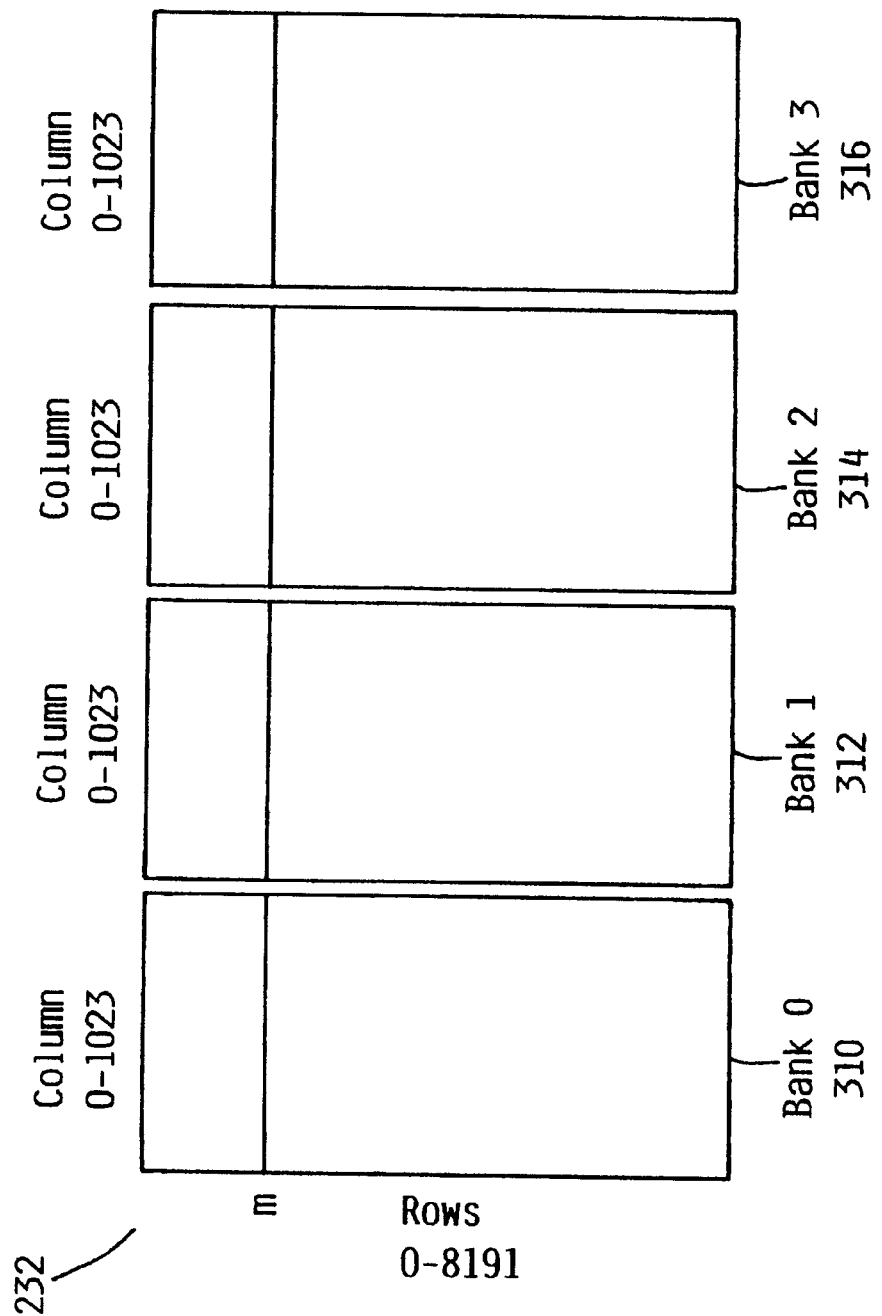
FIG. 3 is a simplified block diagram of an address map for four memory banks in a memory subsystem that can be used in accordance with principles of the invention.

FIG. 3 is a representation of a memory device 232, preferably a DDR-II, having four banks 310, 312, 314, 316. Each bank has $2^{13}$ or 8K rows and $2^{10}$ or 1K columns although shown here as equal in memory size, the memory banks can be different sizes from chip to chip but are usually the same size on the same chip. Memory banks are arranged in a matrix of columns and rows and are accessed by a Bank Activate (BA) command to select the bank and row, and either a Read or Write command to activate the column. In some applications, however, data is written in one memory bank across the columns and then the row is incremented until a single memory bank is filled. Thus, row m−1 of Bank 0 would be filled, then row m of the same Bank 0, then row m+1 of Bank 0 until all the rows of Bank 0 are filled. Bank 1 is then opened and filled or read. If, however, data is written across the same row in different memory banks, a separate RAS signal need not be generated. But, in current DDR-IIs with the conventional accessing scheme, to access a separate memory bank requires a new bank address command signal which in turn requires an intermediate dead cycle as explained in the discussion of FIG. 1.

Figure 4:
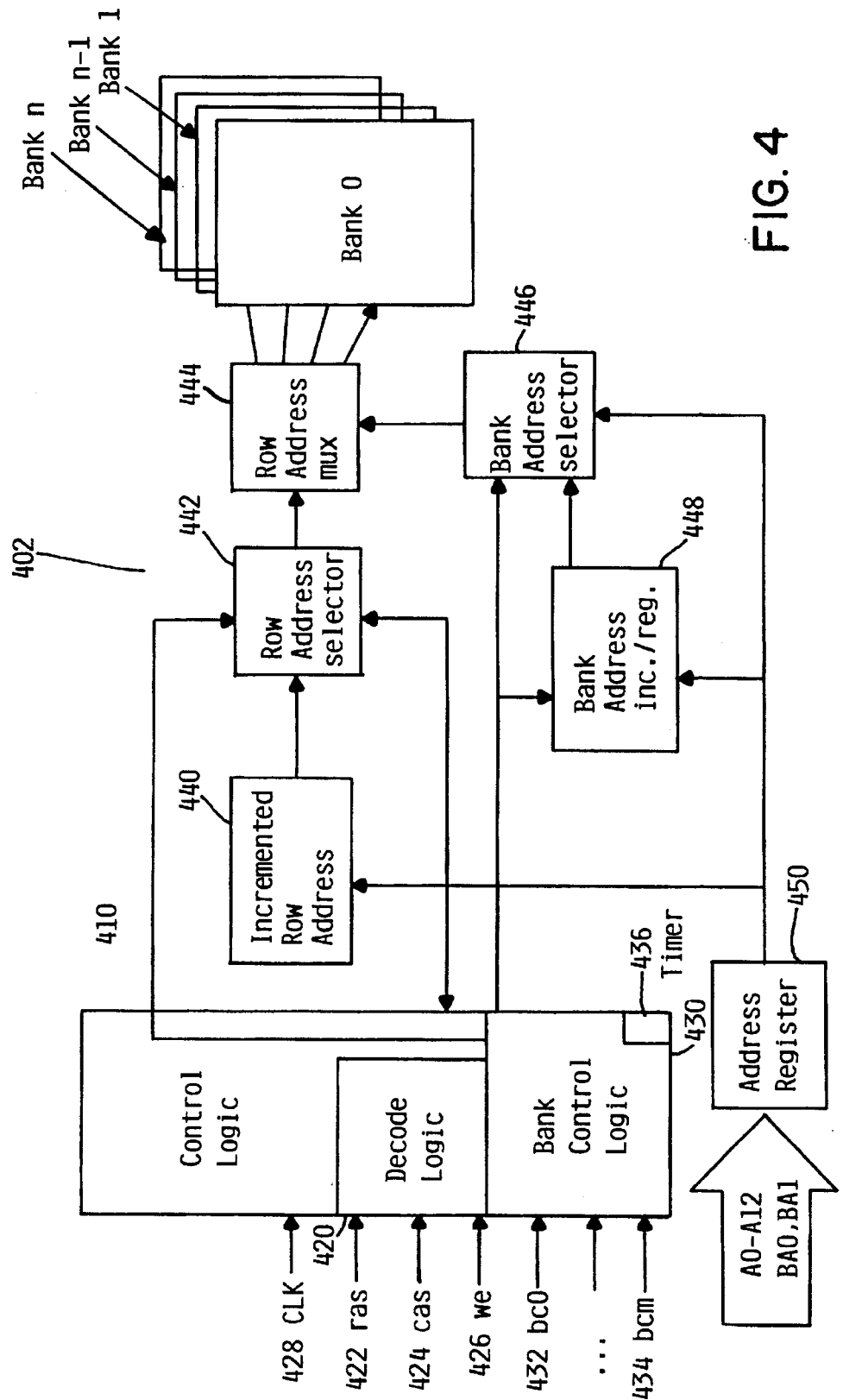
FIG. 4 is a simplified block diagram of control logic within the memory devices or storage controller to address memory banks in a memory subsystem. It is suggested that FIG. 4 be printed on the face of the patent.

FIG. 4 is a simplified block diagram of the memory bank logic 402 within a memory device 232 that can be used to open multiple banks with a single command of a synchronous DRAM. Alternatively memory bank logic 402 may be contained within storage controller 190 to control opening multiple drives or other memory devices in external storage192. Memory bank logic 402 includes control logic 410 of which there is decode logic to decode command inputs which may include, inter alia, a clock signal CLK 428, row and column activate signals (RAS) 422 and (CAS) 424, and the write enable (WE) signal 426; there may be other signal inputs to control logic 410 that are not shown. Permutations of these command inputs provide specific active commands to the memory which may include Bank Activate, Read, Write, precharge, and auto refresh.

The bank control logic 430 controls what banks to open and the timing of when the banks will be opened. The memory banks may be opened all at once or may be opened sequentially in a staggered manner. Timer 436 within the bank control logic 430 provides either an asynchronous or a synchronous deterministic time delay to open subsequent memory banks according to the principles of the invention. Input signals bc0 432 . . . bcm 434 are decoded and one schema for decoding the signals is forth in the table below to provide a single command to open one or more of the memory banks of a memory device. Output from the control logic 410 are input to the incremented/decremented row address 440, the bank address incrementer/decrementer register 448 and the bank address selector 446 to determine which memory bank to open. The address of the bank is (BA0, BA1) and the row address A0–A12 are input to the bank address incrementer/decrementer register 448 and bank address selector 446, and the row address incrementer/decrementer 440 and row address selector 442, respectively. Input from the row address selector 442 and the bank address selector 446 are provided to the row address multiplexer 444 to open one or more of the four memory banks. The table below represents the logic to provide a single command to open one or more memory bank. A two-bit address is used if there are four memory banks; one of skill in the art will know how to extend the addressing scheme to n banks with m bits where m=In(n)/In(2).

| signal bc0 | signal bc1 | result |
|---|---|---|
| 0 | 0 | Open bank with address (BA0,BA1) only |
| 0 | 1 | Open bank with address (BA0,BA1) and next bank |
| 1 | 0 | Open bank with address (BA0,BA1) and next two banks |
| 1 | 1 | Open bank with address (BA0,BA1) and next three banks |

Figure 5:
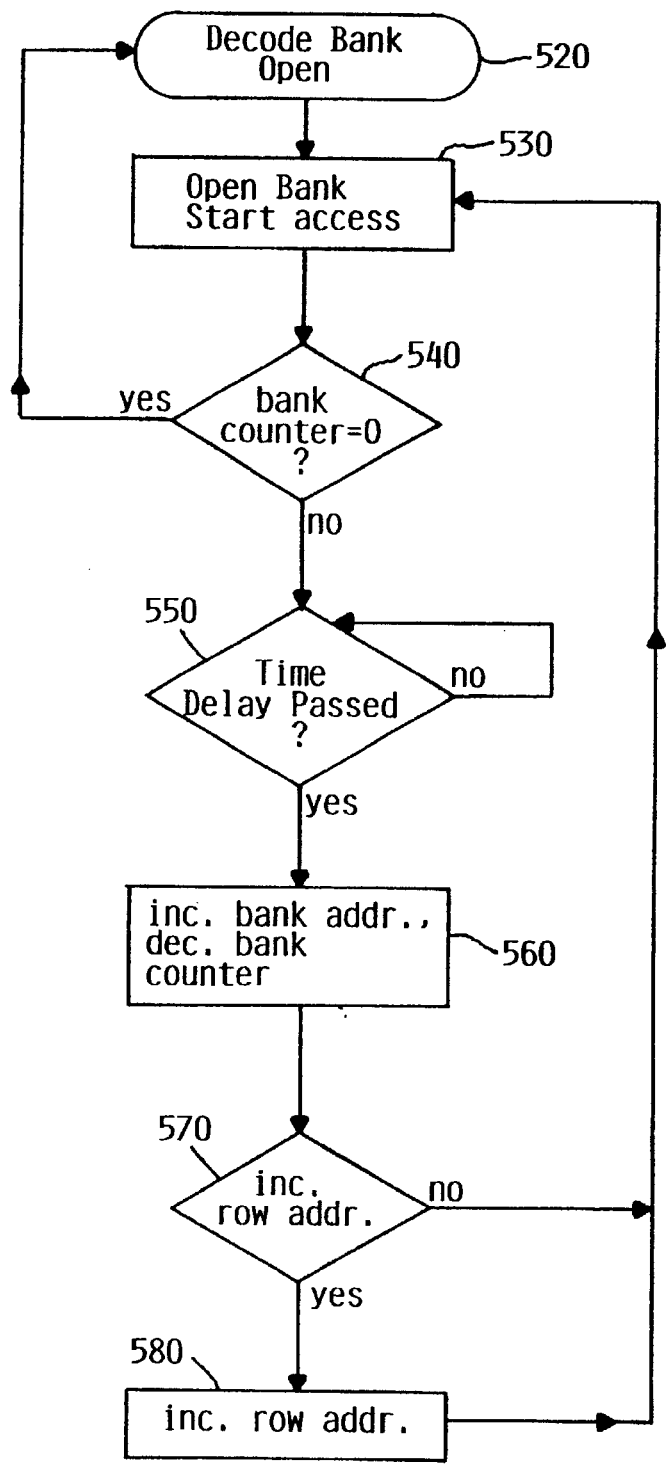
FIG. 5 is a simplified flow chart of a memory bank process implementing a command to open multiple memory banks in accordance with principles of the invention.

FIG. 5 is a flow chart of the process by which the memory control logic 402 may open a row across multiple banks within a memory subsystem. In step 520 the decode logic 420 decodes command inputs 422, 424, 426 and other inputs to generate a command to open a memory bank determined by the address input from address register 450 to the bank address selector 446. Bank control logic 430 has provided the command to determine how many banks will be opened and accordingly a bank counter in the bank address incrementer/register 448 has been set to the corresponding value. In step 530, the first bank having address (BA0, BA1) is opened and accessed according the command inputs. In step 540, a determination is made if the bank counter is zero; if so, then another command is received into the control logic 410. If the bank counter is not zero, then the output of timer 436 is checked at step 550 to determine if sufficient time has passed to open the next bank. The time delay can be deterministic and may be programmable; the delay could be synchronous, i.e., a multiple of a clock edge, or asynchronous in that some period of time unrelated to the clock signal has passed, e.g., a few nanoseconds. Under some circumstances discussed earlier in the DDR-II and other memory devices having high memory clock speeds, the signals on the memory bus can settle during the execution of a nop command or a chip deselect command during the time delay. The process will wait that predetermined time. Note that when all the banks are to opened at once the time delay is zero. Once the time has expired and the bank address is incremented and the bank counter is decremented as in step 560. The process further inquires at step 570 to determine if the row is to be incremented/decremented. If the row is the same, then the next bank is opened at step 530 at the next timing edge of the clock signal. Optionally, data can be burst into/from the rows across bank boundaries. If, however, the row is to be incremented/decremented at step 570, then in step 580 the row address is incremented/decremented and a new row from the next bank or all banks are opened and access to the first row of the first bank begins, as in step 530. Columns may also be addressed uniquely or incremented/decremented once the banks are open with the appropriate signals.

Figure 6A:
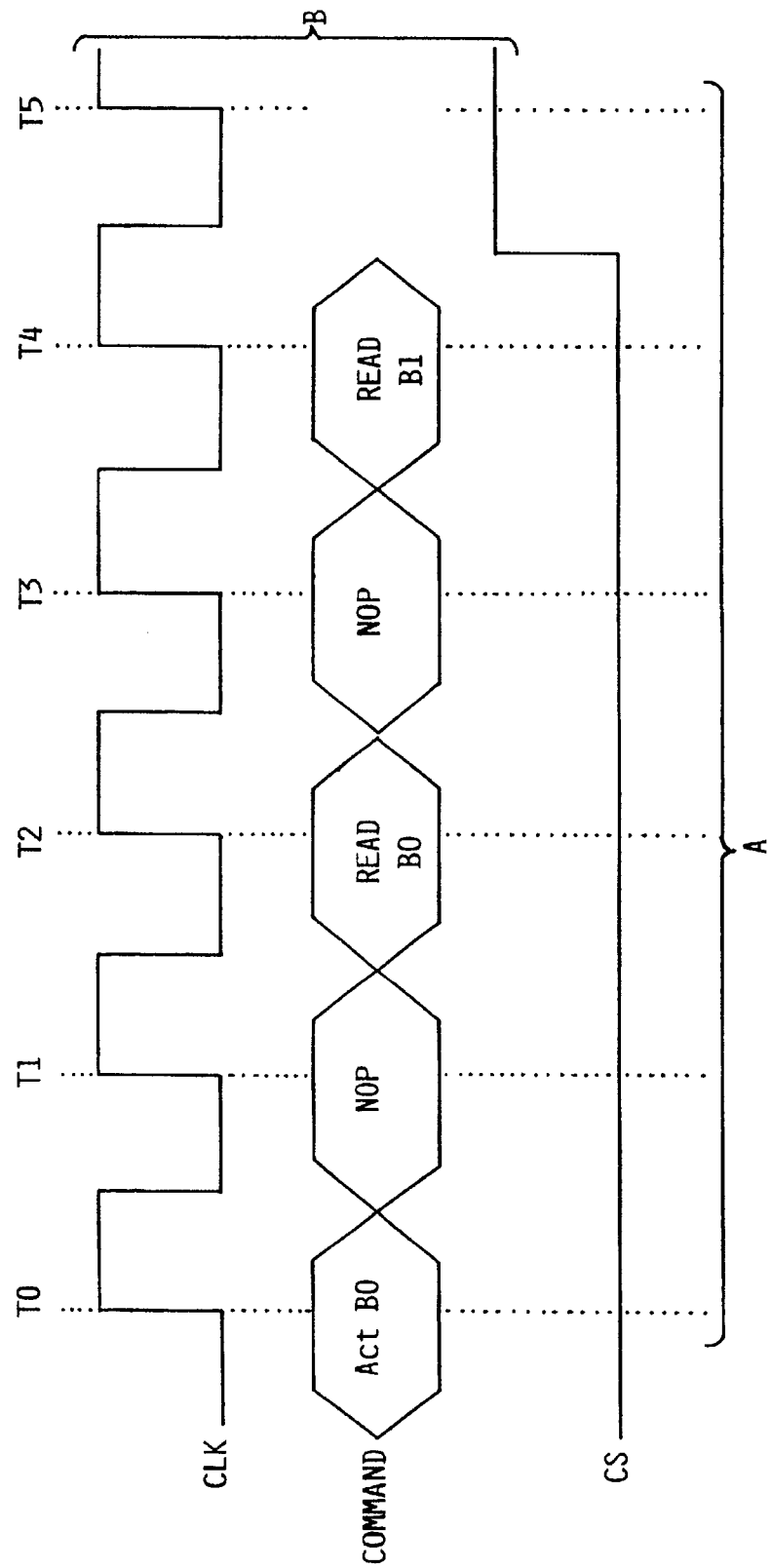
FIG. 6 is a timing diagram of multiple bank activate and read commands and the resultant output data according to an embodiment of the invention in which all the memory banks are opened at once.
Figure 6B:
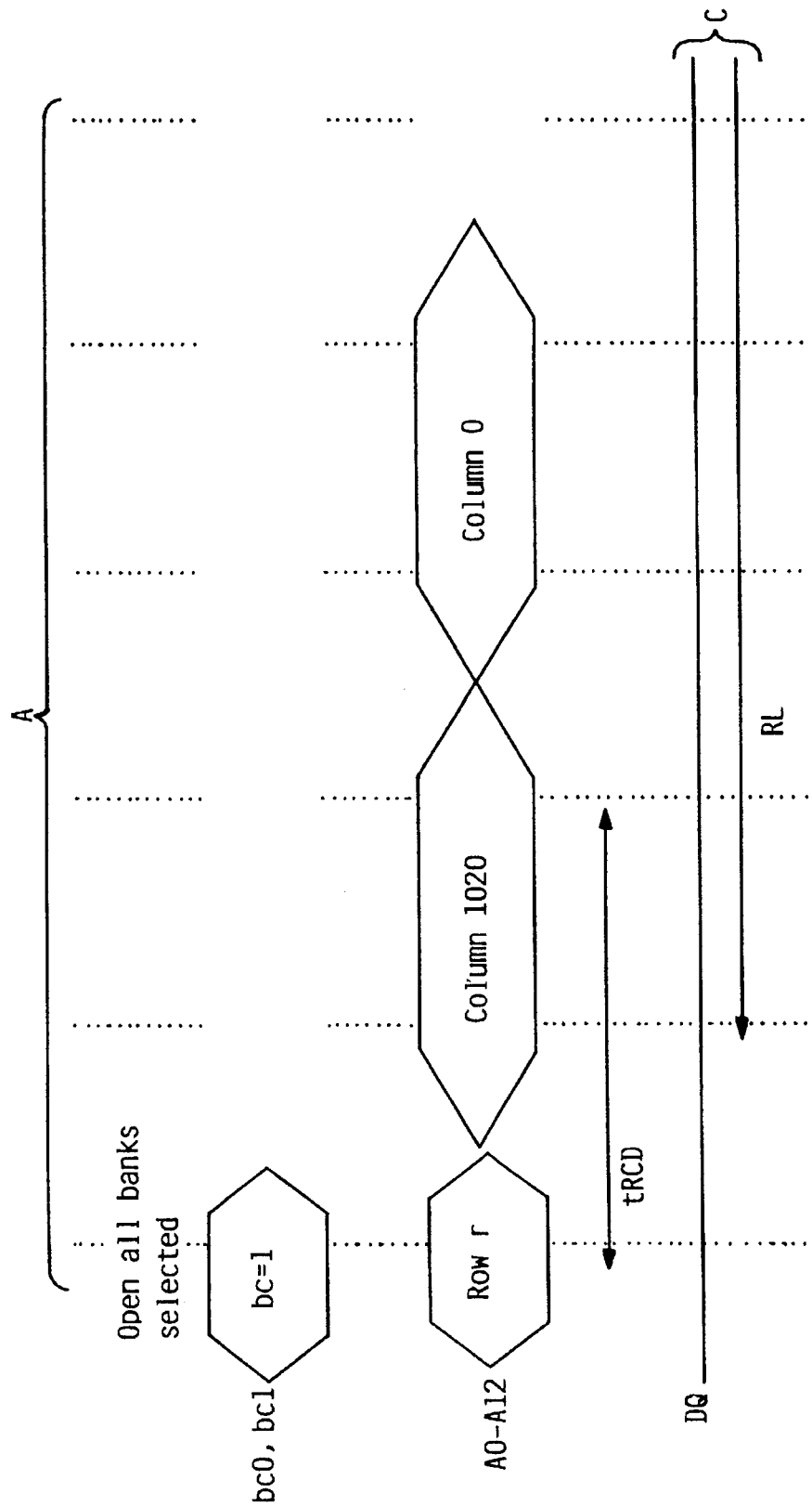
Figure 6C:
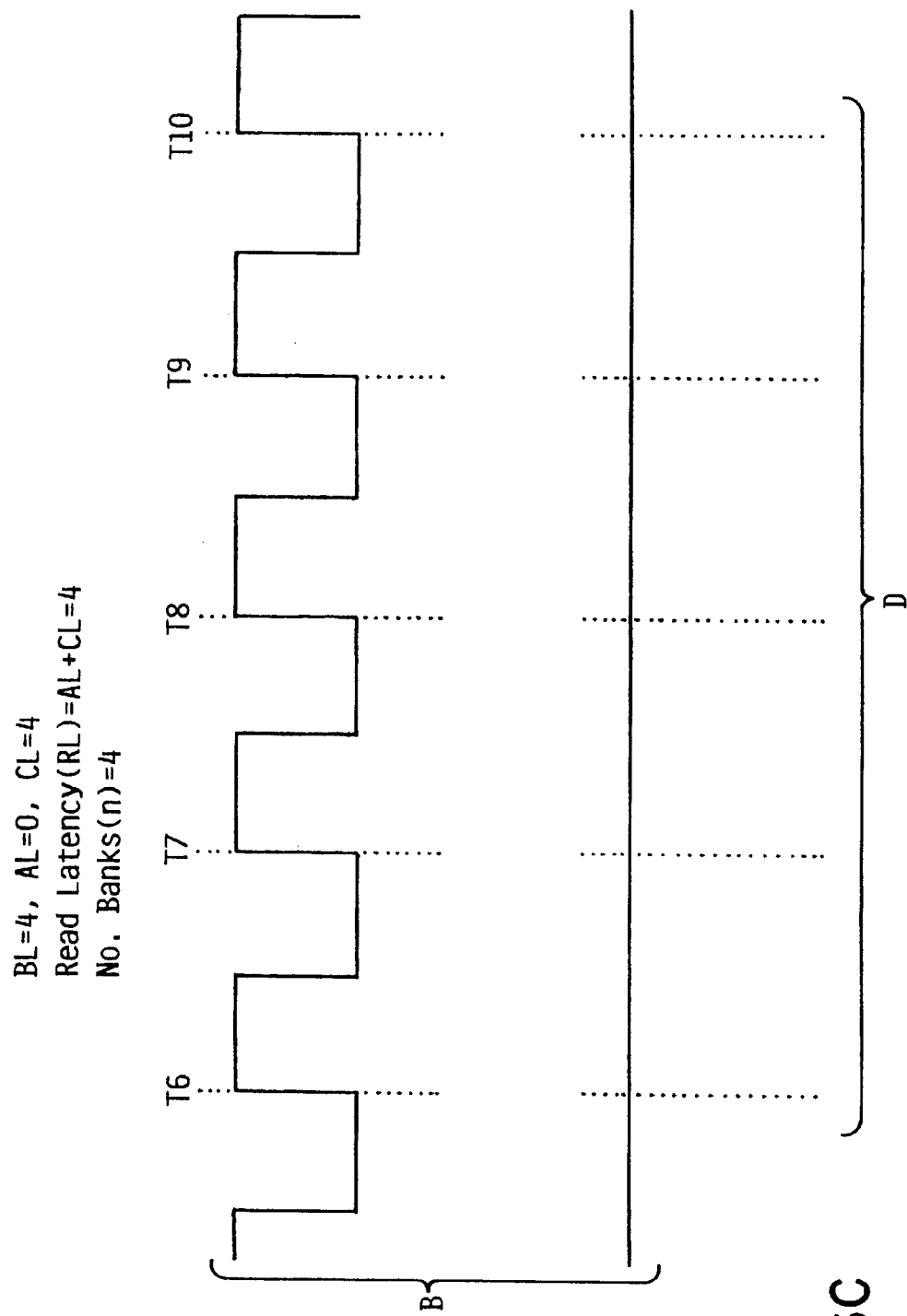
Figure 7A:
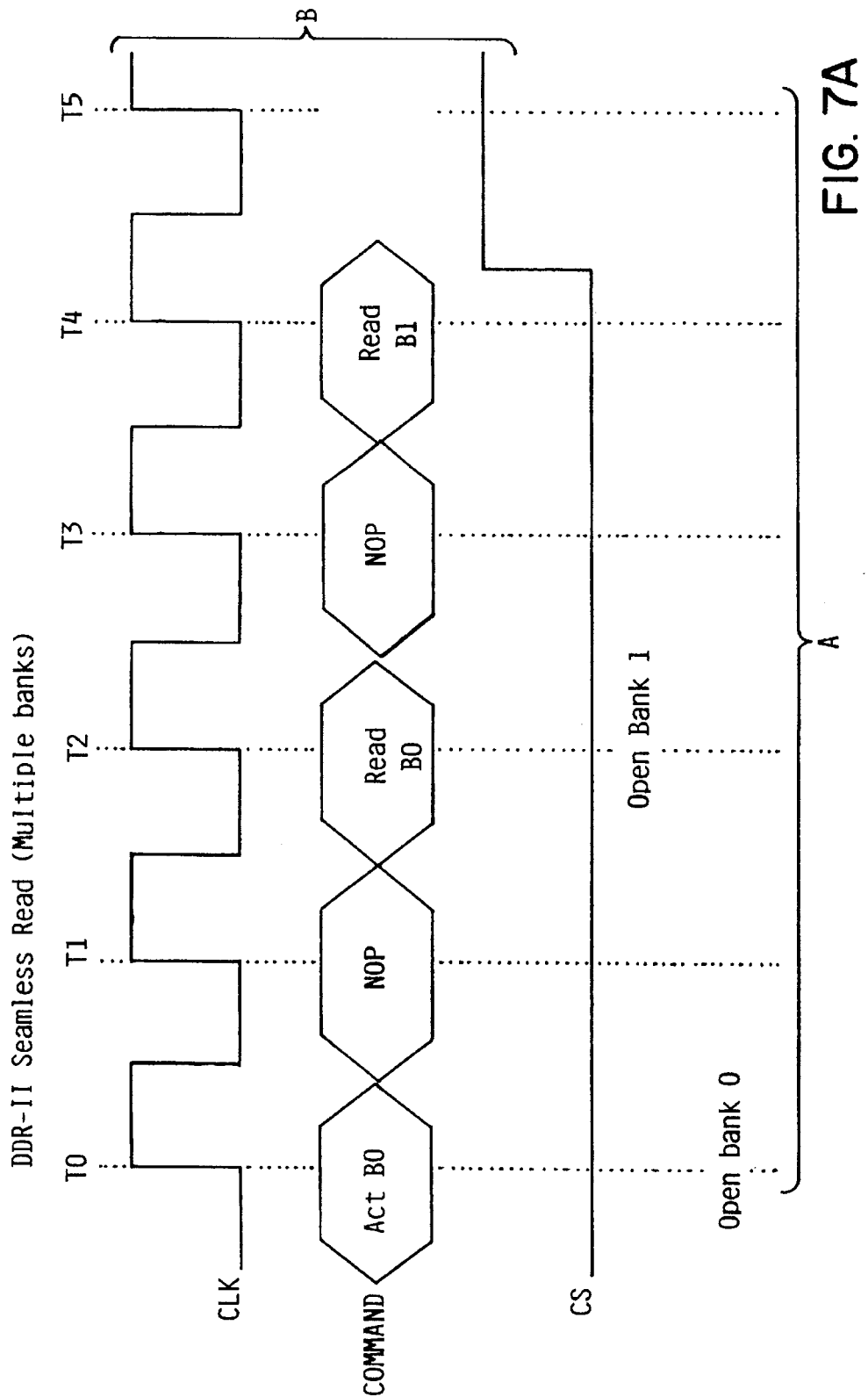
FIG. 7 is a timing diagram of sequential bank activate and read commands and the resultant output according to another embodiment of the invention.
Figure 7B:
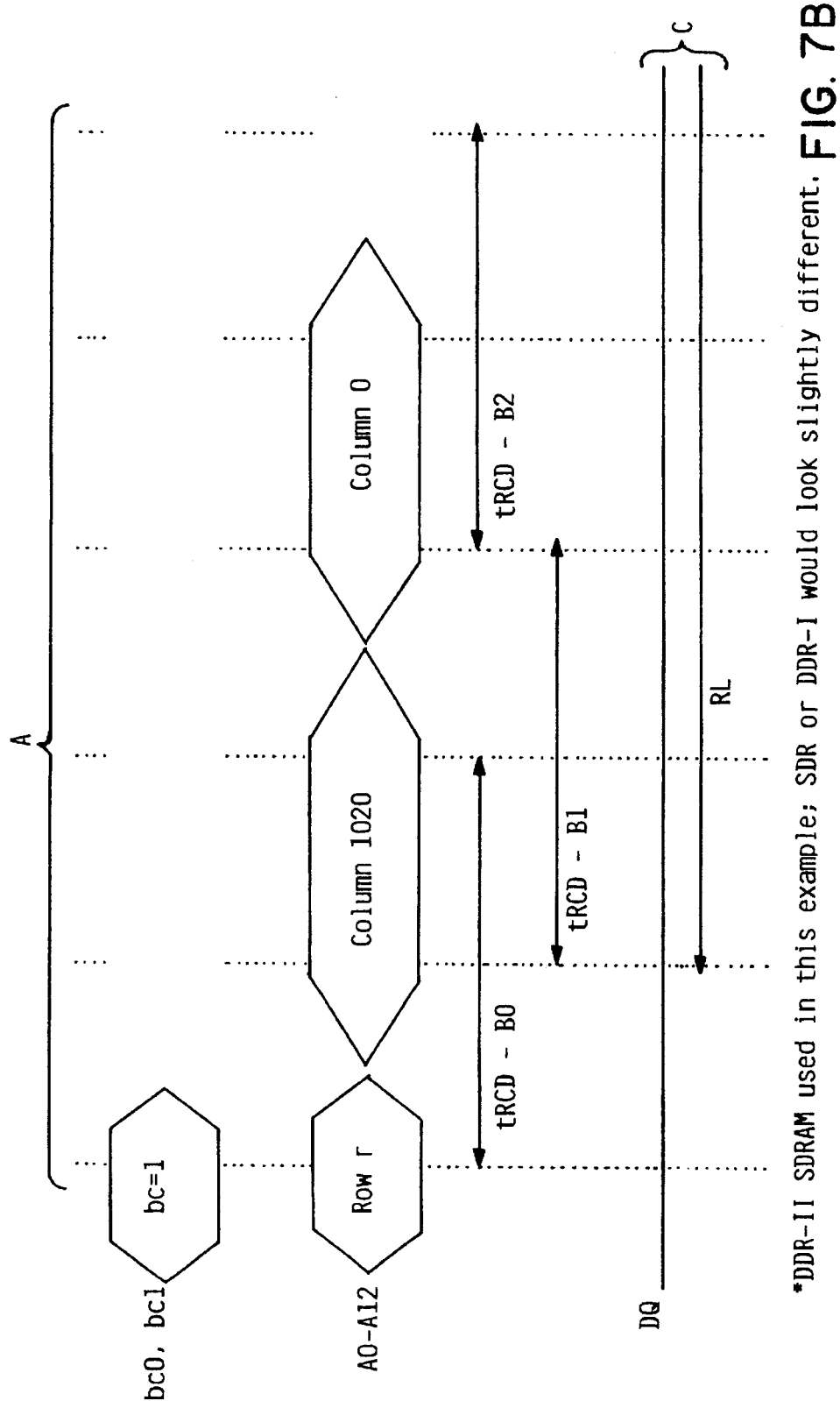
Figure 7C:
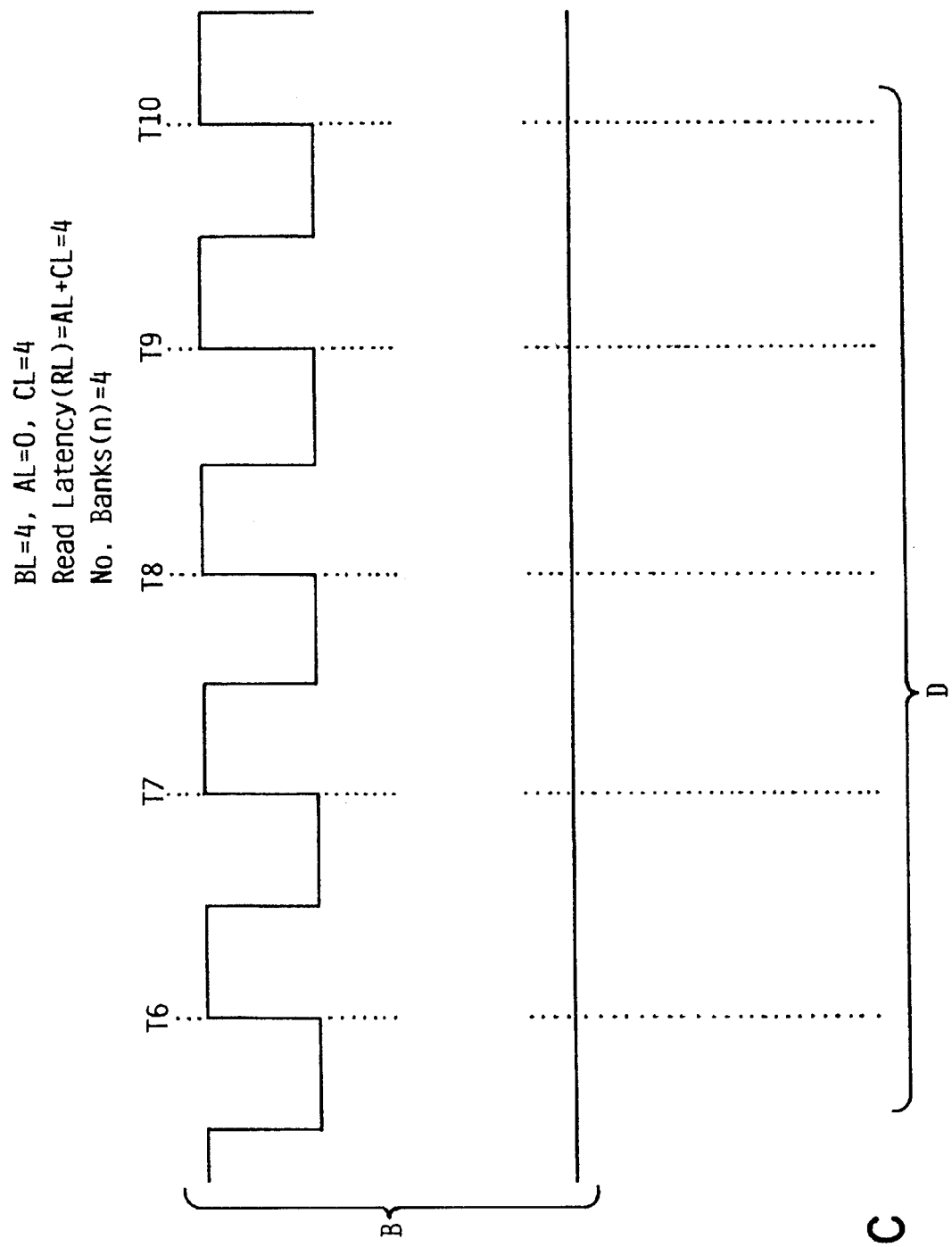
Figure 7D:
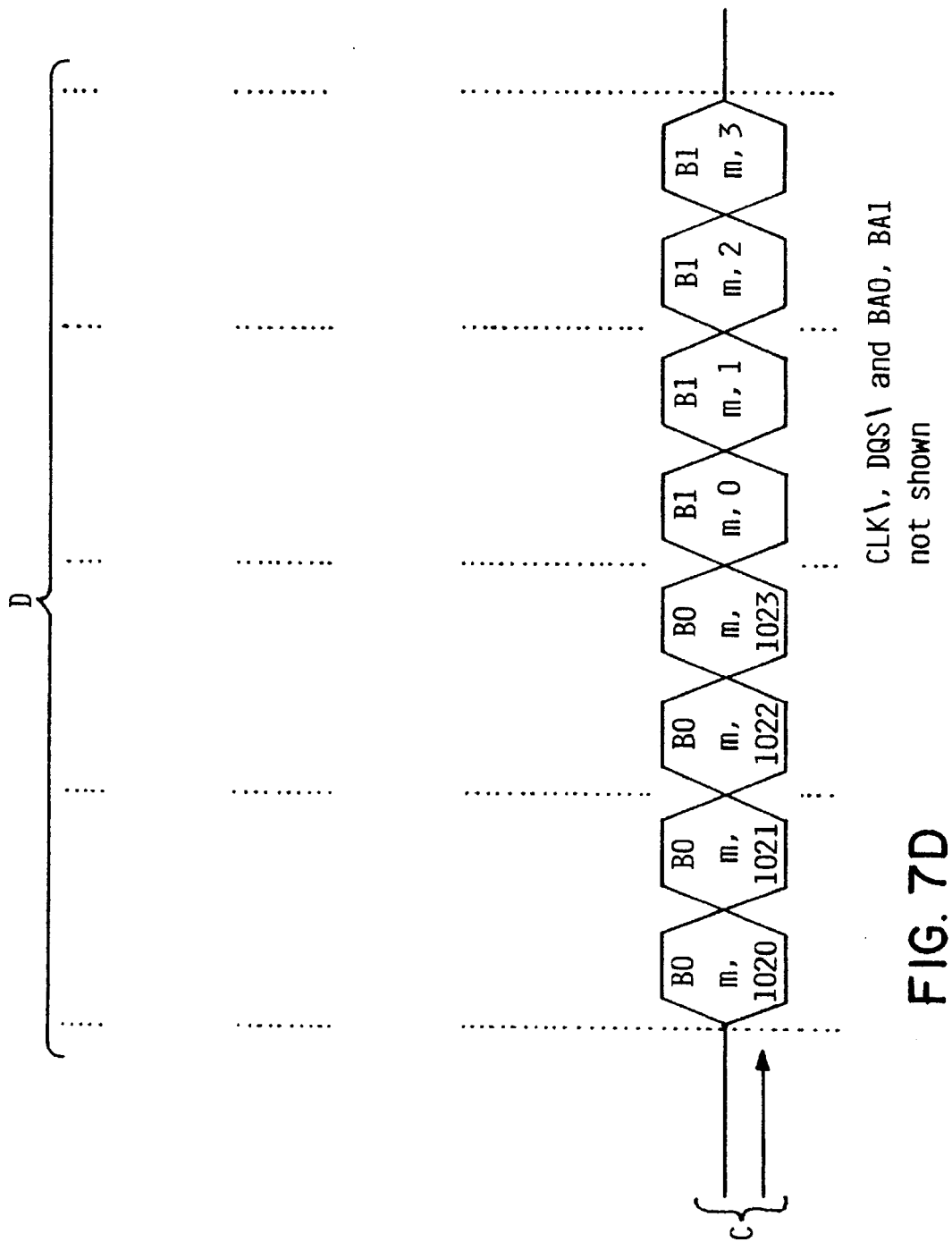

FIGS. 6 and 7 are timing diagrams of the seamless read of multiple memory banks in accordance with the invention. In FIG. 6, the single command indicates that the bank counter, bc=1, which will open two banks. Note that all the banks are opened at the same time T0 beginning at bank (BA0, BA1) at row r. At time T1, a nop command and the column address A0–A12 of column 1020 are being driven on the command bus. At time T2, access to the banks begin with a Read B0 command. Note that at time T3, a nop command and a column address of column 0 are being driven on the bus and then, at time T4, access begins to the second bank, same row, at column 0. At time T6, the resulting data DQ begins to be output from bank (BA0,BA1) and bursts continuously across the banks.

Opening a number of banks simultaneously requires substantial power so in order to conserve power subsequent banks could be opened in a staggered manner without interruption of the data burst; one embodiment is shown in the timing diagram of FIG. 7. In this embodiment, not all the banks are opened at time T0 but the next bank is opened at time T2 and data output DQ is continuously burst across bank boundaries. For example, a command to open Bank 0 could occur at T0 with a command to open subsequent banks every second or third or fourth clock cycle. The number of clock cycles is dependent upon a particular architecture and application. The deterministic time delay, moreover, need not be clocked. A nop command or a chip deselect command may be executed during the time delay.

Breaking a data burst transfer degrades performance so storing data in memory banks in the same row across bank boundaries and accessing the data as described above is especially useful for vector processing or for solving systems of equations involving large amounts of organized data. The invention is also useful when the data is video data associated with an image or a video monitor. Such a technique is also useful with audio I/O such as portable compact disk or video disk players. Likewise, the invention can be used to access data in the same columns across bank boundaries in synchronous dynamic random access memory. In this case with the DDR-II implementation, the read and write command inputs 422–426 to the decode logic 420 would have to be decoded in the first step 520 of the flow chart of FIG. 5 as well as the bank control logic. The invention is particularly suitable for use with I/O adapters for large external storage having fast memory bus speeds which require some settling time on the bus before another command can be driven. While various embodiments of the present invention have been described above, it should be understood that they have been presented by way of example, and not limitation, and variations are possible. For instance, the invention accommodates different size banks within the memory. Thus, the breadth and scope of the present invention should not be limited by any of the above-described exemplary embodiments, but should be defined only in accordance with the following claims and their equivalents.

What is claimed is:

1. A method of controlling access to one or more memory banks in a synchronous dynamic random access memory system, comprising the steps of:
   (a) reading a single command to open one or more of a plurality of synchronous dynamic random access memory banks;
   (b) opening one of said plurality of memory banks; and
   (c) providing an option to open more than one of said plurality of memory banks.

2. The method of claim 1, further comprising:
   (a) determining that more than one of said plurality of memory banks is to be opened; and
   (b) opening another of said plurality of memory banks.

3. The method of claim 2, wherein said step of opening another of said plurality of memory banks opens said memory banks sequentially.

4. A method of controlling access to one or more memory banks in a synchronous dynamic random access memory system, comprising the steps of:
   (a) reading a single command to open one or more of a plurality of synchronous dynamic random access memory banks;
   (b) opening one of said plurality of memory banks;
   (c) providing an option to open more than one of said plurality of memory banks
   (d) determining that more than one of said plurality of memory banks is to be opened; and
   (e) opening all of said memory banks at the same time.

5. The method of claim 4, further comprising:
   (a) incrementing a bank address before said step of opening another of said plurality of memory banks.

6. The method of claim 5, further comprising:
   (a) decrementing a bank counter during said step of opening another of said plurality of memory banks.

7. The method of claim 6, further comprising incrementing/decrementing a row before said step of opening another of said plurality of memory banks.

8. The method of claim 5, further comprising incrementing/decrementing a column before said step of opening another of said plurality of memory banks.

9. The method of claim 5, further comprising uniquely addressing a different column before said step of opening another of said memory banks.

10. The method of claim 4, further comprising:
    (a) bursting data to/from said open memory banks.

11. The method of claim 10, wherein said bursting data is to/from the same row of said plurality of open memory banks.

12. The method of claim 10, wherein said burst data is to/from the same column of said plurality of open memory banks.

13. The method of claim 10, wherein said memory banks are opened sequentially with each subsequent bank opening while bursting data to/from said open memory banks.

14. A method of controlling access to one or more memory banks in a synchronous dynamic random access memory system, comprising the steps of:
    (a) reading a single command to open one or more of a plurality of synchronous dynamic random access memory banks;
    (b) opening one of said plurality of memory banks;
    (c) providing an option to open more than one of said plurality of memory banks
    (d) determining that more than one of said plurality of memory banks is to be opened; and
    (e) opening said memory banks sequentially with one of each subsequent bank opened after a synchronous deterministic time delay.

15. The method of claim 14, further comprising executing a nop command during said time delay.

16. The method of claim 14, further comprising executing a chip deselect command during said time delay.

17. The method of claim 14, further comprising:
    (a) incrementing a bank address before said step of opening another of said plurality of memory banks.

18. The method of claim 14, further comprising incrementing/decrementing a row before said step of opening another of said plurality of memory banks.

19. The method of claim 17, further comprising incrementing/decrementing a column before said step of opening another of said plurality of memory banks.

20. The method of claim 17, further comprising uniquely addressing a different column before said step of opening another of said memory banks.

21. The method of claim 14, further comprising:
    (a) bursting data to/from said open memory banks.

22. The method of claim 21, wherein said bursting data is to/from the same row of said plurality of open memory banks.

23. The method of claim 21, wherein said burst data is to/from the same column of said plurality of open memory banks.

24. A method of controlling access to one or more memory banks in a synchronous dynamic random access memory system, comprising the steps of:
    (a) reading a single command to open one or more of a plurality of synchronous dynamic random access memory banks;
    (b) opening one of said plurality of memory banks;
    (c) providing an option to open more than one of said plurality of memory banks
    (d) determining that more than one of said plurality of memory banks is to be opened; and
    (e) opening said memory banks sequentially with one of each subsequent bank opened after an asynchronous deterministic time delay.

25. The method of claim 24, further comprising executing a nop command during said time delay.

26. The method of claim 24, further comprising executing a chip deselect command during said time delay.

27. The method of claim 21, wherein said memory banks are opened sequentially with each subsequent bank opening while bursting data to/from said open memory banks.

28. The method of claim 24, further comprising:
    (a) incrementing a bank address before said step of opening another of said plurality of memory banks.

29. The method of claim 24, further comprising incrementing/decrementing a row before said step of opening another of said plurality of memory banks.

30. The method of claim 28, further comprising incrementing/decrementing a column before said step of opening another of said plurality of memory banks.

31. The method of claim 28, further comprising uniquely addressing a different column before said step of opening another of said memory banks.

32. The method of claim 24, further comprising:

(a) bursting data to/from said open memory banks.

33. The method of claim 32, wherein said bursting data is to/from the same row of said plurality of open memory banks.

34. The method of claim 32, wherein said burst data is to/from the same column of said plurality of open memory banks.

35. The method of claim 32, wherein said memory banks are opened sequentially with each subsequent bank opening while bursting data to/from said open memory banks.

36. A method to open one or more multiple data banks of a memory system, comprising the steps of:

(a) reading a command to open one or more of a plurality of memory banks, (b) opening one of said plurality of memory banks;

(c) determining that more than one of said plurality of memory banks is to be opened and generating a single command to open more than one of said plurality of memory banks;

(d) incrementing a bank address;

(e) opening another of said plurality of memory banks; and (f) bursting data to/from the same row of said open memory banks.

37. A computer system, comprising:

(a) a computer processor, (b) a memory connected on a bus to said processor, said memory comprising a memory controller connected on a memory bus to a plurality of synchronous dynamic memory banks, said memory controller to generate a single command having the option to open more than one of said memory banks; and (c) a plurality of bus units connected to said processor and/or said memory via an external bus, said processor and or one of said bus units to request access to an address in said memory banks.

38. The computer system of claim 37, wherein said computer processor is an I/O processor/adapter and said memory controller is a storage controller; and one of said bus units is a second processor connected to said storage controller which is further connected to said external bus which is a peripheral computer interface (PCI) bus.

39. The computer system of claim 37, wherein said storage controller is further connected across a small computer system interface (SCSI) bus to a larger memory device.

40. A synchronous memory system, comprising:

(a) means to access one or more synchronous dynamic random access memory banks;

(b) means to decode a plurality of commands on a memory command bus to access said plurality of synchronous dynamic random access memory banks;

(c) means to provide the option to open one or more of said synchronous dynamic random access memory banks with a single command;

(d) means to open said synchronous dynamic random access memory banks; and (e) means to input/output data continuously from said opened synchronous dynamic random access memory banks.

* * * * *